(12) United States Patent
Park (10) Patent No.: US 12,276,700 B2
(45) Date of Patent: Apr. 15, 2025

(54) RELAY STATE MANAGEMENT APPARATUS AND OPERATING METHOD THEREOF

(71) Applicant: LG Energy Solution, Ltd., Seoul (KR)

(72) Inventor: Hee Ju Park, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 58 days.

(21) Appl. No.: 17/913,036

(22) PCT Filed: Oct. 29, 2021

(86) PCT No.: PCT/KR2021/015479
§ 371 (c)(1),
(2) Date: Sep. 20, 2022

(87) PCT Pub. No.: WO2022/114559
PCT Pub. Date: Jun. 2, 2022

(65) Prior Publication Data
US 2023/0176127 A1 Jun. 8, 2023

(30) Foreign Application Priority Data
Nov. 27, 2020 (KR) .................. 10-2020-0163243

(51) Int. Cl.
G01R 31/327 (2006.01)
G01R 15/04 (2006.01)
G01R 19/04 (2006.01)
G01R 31/00 (2006.01)
G01R 31/36 (2020.01)

(52) U.S. Cl.
CPC ......... G01R 31/3278 (2013.01); G01R 19/04 (2013.01)

(58) Field of Classification Search
CPC ........ G01R 31/00; G01R 31/02; G01R 31/20; G01R 31/327; G01R 31/36; G01R 19/04; G01R 15/04
See application file for complete search history.

(56) References Cited

U.S. PATENT DOCUMENTS 11,313,908 B2 * 4/2022 Wang .................... B60L 3/0046
2006/0021098 A1 * 1/2006 Tezuka ................. H01H 47/002
477/7

(Continued)

FOREIGN PATENT DOCUMENTS

JP 4265381 * 11/2003
JP 2007329045 A 12/2007

(Continued)

OTHER PUBLICATIONS

Extended European Search Report including Written Opinion for Application No. 21898385.6 dated Sep. 15, 2023, pp. 1-10.

(Continued)

*Primary Examiner* — Neel D Shah
(74) *Attorney, Agent, or Firm* — Lerner David LLP (57) ABSTRACT

A relay state management apparatus including a switch connected to an end of a battery module, a resistor unit connected to the switch, a voltage measuring unit measuring a voltage applied to the resistor unit, a relay connected between the battery module and a load, and a controller controlling the switch and the relay to be short-circuited and diagnosing a state of the relay based on the voltage measured by the voltage measuring unit.

13 Claims, 8 Drawing Sheets

(56) References Cited

U.S. PATENT DOCUMENTS

| | | |
|---|---|---|
| 2015/0346282 A1* | 12/2015 | Jeon .................. G01R 31/3278 324/418 |
| 2016/0223615 A1 | 8/2016 | Nishi et al. |
| 2018/0315568 A1 | 11/2018 | Zhao et al. |
| 2019/0047436 A1 | 2/2019 | Song |
| 2019/0146040 A1* | 5/2019 | Murakami ............ B60L 3/0046 324/430 |
| 2020/0049768 A1 | 2/2020 | Matsukawa et al. |
| 2020/0083732 A1 | 3/2020 | Kim et al. |
| 2020/0142002 A1 | 5/2020 | Park et al. |
| 2020/0166574 A1 | 5/2020 | Lee |
| 2020/0174077 A1 | 6/2020 | Gil |
| 2020/0298725 A1 | 9/2020 | Shin et al. |
| 2020/0326374 A1 | 10/2020 | Park et al. |
| 2021/0231707 A1 | 7/2021 | Ock et al. |
| 2022/0260638 A1 | 8/2022 | Park et al. |

FOREIGN PATENT DOCUMENTS

| | | |
|---|---|---|
| JP | 4265381 B2 | 5/2009 |
| JP | 2009183134 A | 8/2009 |
| JP | 4570859 B2 | 10/2010 |
| JP | 6146332 B2 | 6/2017 |
| JP | 2019518212 A | 6/2019 |
| JP | 2019174165 A | 10/2019 |
| JP | 2020523578 A | 8/2020 |
| KR | 20060014029 A | 2/2006 |
| KR | 20130126146 A | 11/2013 |
| KR | 101440531 B1 | 9/2014 |
| KR | 20140136844 A | 12/2014 |
| KR | 101795319 B1 | 12/2017 |
| KR | 20190051555 A | 5/2019 |
| KR | 20190071320 A | 6/2019 |
| KR | 20200076423 A | 6/2020 |
| KR | 20200087618 A | 7/2020 |
| KR | 20200111314 A | 9/2020 |
| KR | 20200119516 A | 10/2020 |

OTHER PUBLICATIONS

International Search Report for Application No. PCT/KR2021-015479 mailed Feb. 7, 2022, pp. 1-3.

* cited by examiner

RELAY STATE MANAGEMENT APPARATUS AND OPERATING METHOD THEREOF

TECHNICAL FIELD

Cross-Reference to Related Application

The present application is a national phase entry under 35 U.S.C. § 371 of International Application No. PCT/KR2021/015479 filed Oct. 29, 2021, which claims priority from Korean Patent Application No. 10-2020-0163243 filed Nov. 27, 2020, all of which are incorporated herein by reference.

TECHNICAL FIELD

Embodiments disclosed herein relate to a relay state management apparatus and an operating method thereof.

BACKGROUND ART

Recently, research and development of secondary batteries have been actively performed. Herein, the secondary batteries, which are chargeable/dischargeable batteries, may include all of conventional nickel (Ni)/cadmium (Cd) batteries, Ni/metal hydride (MH) batteries, etc., and recent lithium-ion batteries. Among the secondary batteries, a lithium-ion battery has a much higher energy density than those of the conventional Ni/Cd batteries, Ni/MH batteries, etc. Moreover, the lithium-ion battery may be manufactured to be small and lightweight, such that the lithium-ion battery has been used as a power source of mobile devices. In addition, the lithium-ion battery is attracting attention as a next-generation energy storage medium as a usage range thereof is expanded to a power source of electric vehicles.

Generally, a secondary battery is electrically connected to a load through a relay to supply power to the load, such that when the relay does not operate normally, a problem may occur in supplying power to the load. Therefore, there is a need for a technique for accurately diagnosing operation errors or failures of relays.

SUMMARY

Technical Problem

Embodiments disclosed herein provide a relay state management apparatus capable of diagnosing a state of a relay and an operating method of the relay state management apparatus.

Technical problems of the embodiments disclosed herein are not limited to the above-described technical problems, and other unmentioned technical problems would be clearly understood by one of ordinary skill in the art from the following description.

Technical Solution

According to an embodiment of the present invention, there is provided a relay state management apparatus including a switch connected to an end of a battery module, one or more resistors connected to the switch, a voltage sensor measuring a voltage applied to the one or more resistors, a relay connected between the battery module and a load, and a controller configured to control the switch and the relay to be short-circuited and diagnose a state of the relay based on the voltage measured by the voltage sensor.

In an embodiment, the controller may be configured to diagnose the state of the relay based on the measured change amount and a reference change amount that is an amount of change in the voltage previously measured by the voltage sensor for a second predetermine duration beginning from when the controller controls the switch to be short-circuited.

In an embodiment, the controller may be configured to diagnose the state of the relay based on the measured change amount and a reference change amount that is an amount of change in the voltage previously measured by the voltage sensor for a second predetermine duration beginning from when the controller controls the switch to be short-circuited in an open state of the relay.

In an embodiment, the controller may be configured to diagnose the state of the relay as faulty in response to the measured change amount being greater than or equal to a value obtained by multiplying the reference change amount by a predetermined rate and the state of the relay as normal in response to the measured change amount being less than the value obtained by multiplying the reference change amount by the predetermined rate.

In an embodiment, the controller may be configured to diagnose the state of the relay based on the measured change amount and a reference change amount that is an amount of change in the voltage previously measured by the voltage sensor for a duration beginning from when the controller controls the switch to be short-circuited in a short-circuited state of the relay.

In an embodiment, the controller may be configured to diagnose the state of the relay as normal in response to the measured change amount being within a predetermined range from the reference change amount and diagnose the state of the relay as faulty in response to the measured change amount being out of the predetermined range from the reference change amount.

In an embodiment, the one or more resistors may include a first resistor and a second resistor that are serially connected to each other.

In an embodiment, the voltage sensor may be configured to measure a voltage applied to the second resistor.

In an embodiment, the switch may be connected to an anode terminal of the battery module.

According to another embodiment of the present invention, there is provided an operating method of a relay state management apparatus, the operating method including controlling a switch connected between a battery module and one or more resistors and a relay connected between the battery module and a load to be short-circuited measuring a voltage applied to the one or more resistors and diagnosing a state of the relay based on the measured voltage.

In an embodiment, the diagnosing of the state of the relay based on the measured voltage may include obtaining a measured change amount that is an amount of change in the voltage measured for a first predetermined duration beginning from when the switch is short-circuited and diagnosing the state of the relay based on the measured change amount and a reference change amount obtained by previously measuring the amount of change in the voltage applied to the one or more resistors for a second predetermined duration beginning from when the switch is short-circuited in an open state of the relay.

In an embodiment, the method may further include calculating a value by multiplying the reference change amount by a predetermined rate, and the diagnosing of the state of the relay may include diagnosing whether the state of the relay is faulty or normal depending on whether the measured change amount is at least or less than the calculated value, respectively.

In an embodiment, the diagnosing of the state of the relay based on the measured voltage may include obtaining a measured change amount that is an amount of change in the voltage measured for a first predetermined duration beginning from when the switch is short-circuited and diagnosing the state of the relay based on the measured change amount and a reference change amount obtained by previously measuring the amount of change in the voltage applied to the one or more resistors for a second predetermined duration beginning from when the switch is short-circuited in a short-circuited state of the relay.

In an embodiment, the diagnosing of the state of the relay may include diagnosing whether the state of the relay is normal or faulty depending on whether the measured change amount is within or outside of a predetermined range from the reference change amount, respectively.

Advantageous Effects

A relay state management apparatus and an operating method thereof according to an embodiment disclosed herein may diagnose a state of a relay.

The battery management apparatus and method and the battery management system according to an embodiment disclosed herein may charge an auxiliary battery of a battery management apparatus in a power-on state of a target device.

DETAILED DESCRIPTION

Hereinafter, embodiments disclosed in this document will be described in detail with reference to the exemplary drawings. In adding reference numerals to components of each drawing, it should be noted that the same components are given the same reference numerals even though they are indicated in different drawings. In addition, in describing the embodiments disclosed in this document, when it is determined that a detailed description of a related known configuration or function interferes with the understanding of an embodiment disclosed in this document, the detailed description thereof will be omitted.

To describe a component of an embodiment disclosed herein, terms such as first, second, A, B, (a), (b), etc., may be used. These term is used merely for distinguishing one component from another component and does not limit the component to the essence, sequence, order, etc., of the component. The terms used herein, including technical and scientific terms, have the same meanings as terms that are generally understood by those skilled in the art, as long as the terms are not differently defined. Generally, the terms defined in a generally used dictionary should be interpreted as having the same meanings as the contextual meanings of the relevant technology and should not be interpreted as having ideal or exaggerated meanings unless they are clearly defined in the present application.

In the present specification, a 'load' may include an electrical, electronic, or mechanical device that operates by receiving power from a battery pack including a plurality of battery cells, and herein, the 'load' may be described as an example of an electric vehicle (EV), but is not limited thereto.

Figure 1:
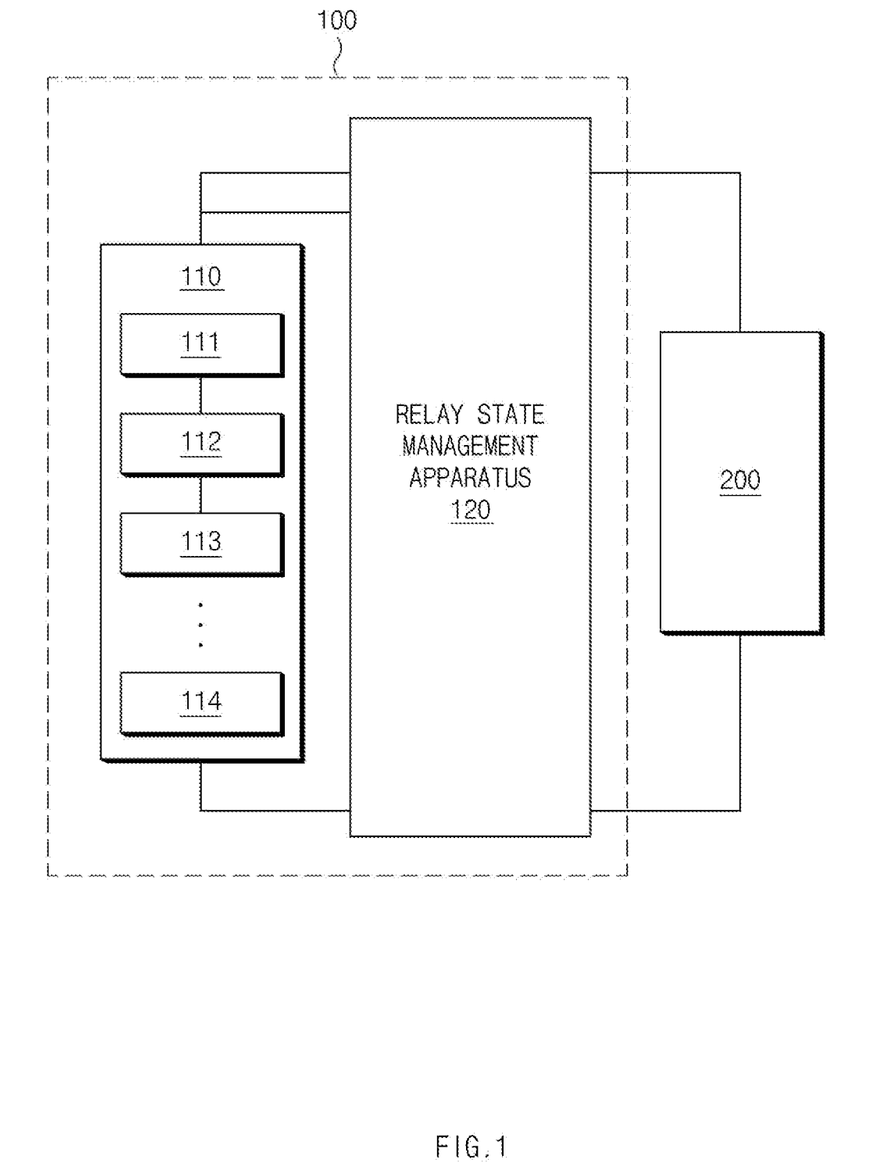
FIG. 1 illustrates a battery pack and a relay state management apparatus according to an embodiment disclosed herein.

FIG. 1 illustrates a battery pack and a relay state management apparatus according to an embodiment disclosed herein.

Referring to FIG. 1, a battery pack 100 according to an embodiment disclosed herein may include a battery module 110 and a relay state management apparatus 120.

The battery module 110 may include a plurality of battery cells 111, 112, 113, and 114. Although the plurality of battery cells are illustrated as four in FIG. 1, the present invention is not limited thereto, and the battery module 110 may include n battery cells (n is a natural number greater than or equal to 2). The battery module 110 may supply power to a load 200. To this end, the battery module 110 may be electrically connected to the load 200 through a relay (described with reference to FIGS. 2 and 3).

The plurality of battery cells 111, 112, 113, and 114 may be a lithium ion (Li-ion) battery, an Li-ion polymer battery, a nickel-cadmium (Ni—Cd) battery, a nickel hydrogen (Ni-MH) battery, etc., and may not be limited thereto. Meanwhile, although one battery module 110 is illustrated in FIG. 1, the battery module 110 may be configured in plural according to an embodiment.

The relay state management apparatus 120 may manage and/or control a state and/or an operation of the battery module 110. For example, the relay state management apparatus 120 may manage and/or control the states and/or operations of the plurality of battery cells 111, 112, 113, and 114 included in the battery module 110. The relay state management apparatus 120 may manage charging and/or discharging of the battery module 110.

In addition, the relay state management apparatus 120 may monitor a voltage, a current, a temperature, etc., of the battery module 110 and/or each of the plurality of battery cells 111, 112, 113, and 114 included in the battery module 110. A sensor or various measurement modules for monitoring performed by the relay state management apparatus 120, not shown, may be additionally installed in the battery module 110, a charging/discharging path, any position of the battery module 110, etc. The relay state management apparatus 120 may calculate a parameter indicating a state of the battery module 110, e.g., a state of charge (SOC), a state of health (SOH) etc., based on a measurement value such as monitored voltage, current, temperature, etc.

The relay state management apparatus 120 may calculate a cell balancing time for the plurality of battery cells 111, 112, 113, and 114. For example, the relay state management apparatus 120 may calculate a cell balancing time based on an SOC of each of the plurality of battery cells 111, 112, 113, and 114. The relay state management apparatus 120 may determine a cell balancing target based on the SOC of each of the plurality of battery cells 111, 112, 113, and 114. The relay state management apparatus 120 may perform a cell balancing operation based on the cell balancing time for a battery cell determined as the cell balancing target among the plurality of battery cells 111, 112, 113, and 114.

In this aspect, the relay state management apparatus 120 may include a function of a battery management system (BMS) that manages the operation/state of the battery module 110.

In addition, the relay state management apparatus 120 may diagnose a state of a relay (described with reference to FIGS. 2 and 3) connecting the battery module 110 with the load 200 based on an internally measured voltage. For example, the relay state management apparatus 120 may diagnose the state of the relay as normal or faulty by using the amount of change in a voltage internally measured in a short-circuited state of the relay (that is, in a state where the battery module 110 and the load 200 are electrically connected to each other). That is, in a situation where the relay state management apparatus 120 controls the relay to be in a short-circuited state, a state where the relay is opened unintentionally or due to a malfunction without being short-circuited may be diagnosed as faulty. A specific operation of the relay state management apparatus 120 will be described in more detail with reference to FIGS. 2 to 5 below.

Figure 2:
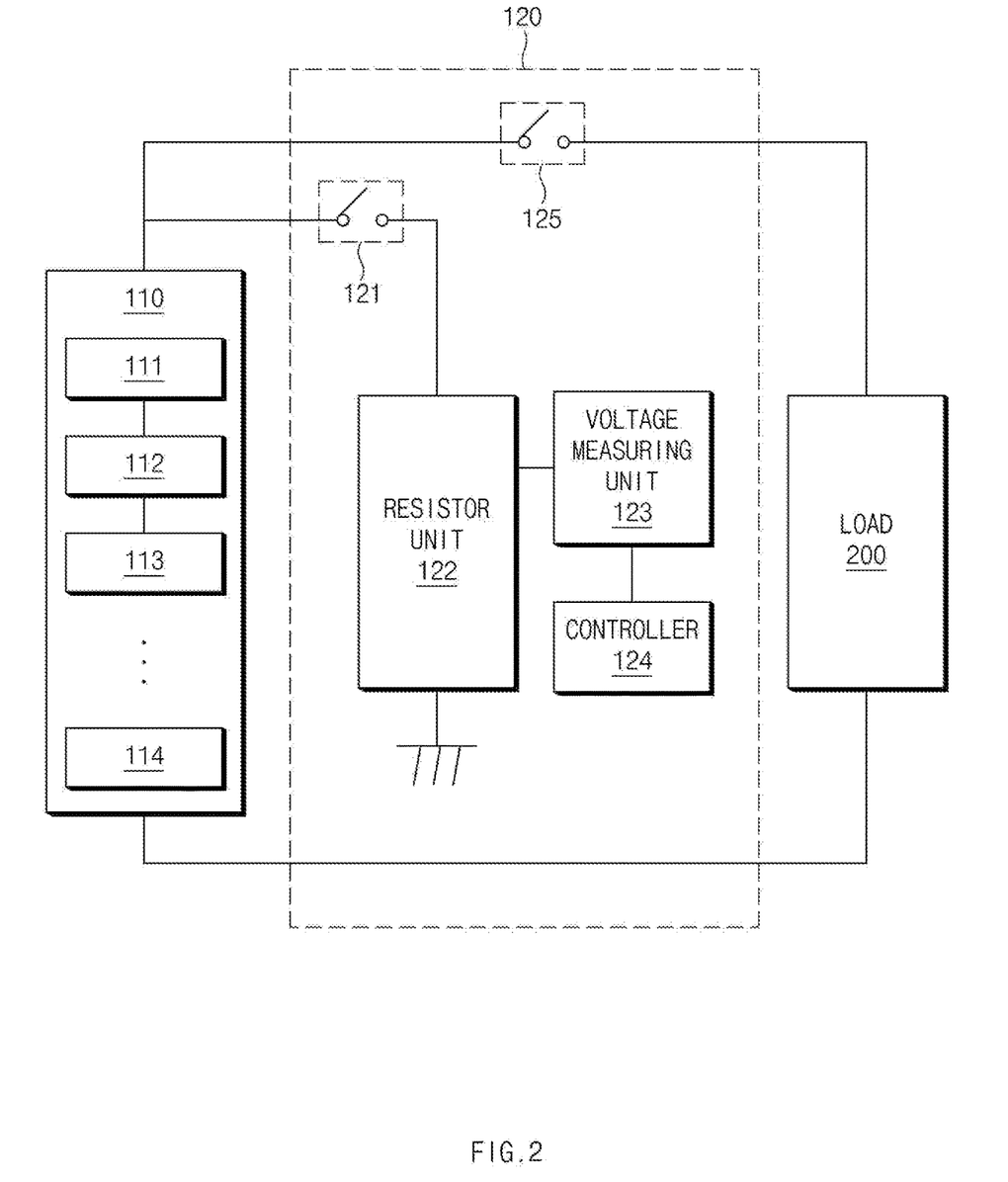
FIG. 2 further illustrates a relay state management apparatus according to an embodiment disclosed herein.

FIG. 2 illustrates a relay state management apparatus according to an embodiment disclosed herein.

Referring to FIG. 2, the relay state management apparatus 120 may include a switch 121, a resistor unit 122, a voltage measuring unit 123, a controller 124, and a relay 125.

The switch 121 may connect the battery module 110 with the resistor unit 122. For example, an end of the switch 121 may be connected to an anode of the battery module 110, and the other end of the switch 121 may be connected to the resistor unit 122. The switch 121 may be opened or short-circuited in response to control by the controller 124.

The resistor unit 122 may be connected to the other end of the switch 121. The resistor unit 122 may be electrically connected to the battery module 110 when the switch 121 is short-circuited. The resistor unit 122 may be connected to the ground.

The voltage measuring unit 123 may measure a voltage applied to the resistor unit 122. For example, the voltage measuring unit 123 may measure the voltage applied to the resistor unit 122 when the switch 121 is short-circuited while the relay 125 is controlled to be short-circuited. The voltage measuring unit 123 may transmit the measured voltage to the controller 124. For example, the voltage measuring unit 123 may measure the voltage applied to the resistor unit 122 in real time to transmit the measured voltage to the controller 124.

The controller 124 may control operations of the switch 121 and the relay 125. For example, the controller 124 may open or short-circuit the relay 125 in response to a control command transmitted from the load 200. When the relay 125 is short-circuited, the load 200 may be provided with power from the battery module 110. The controller 124 may open or short-circuit the switch 121 according to an operation state or an operation situation of the battery pack 100 and/or the battery module 110.

The controller 124 may diagnose the state of the relay 125 based on the voltage measured by the voltage measuring unit 123. For example, while controlling the relay 125 to be short-circuited, the controller 124 may obtain a measured change amount that is the amount of change in the voltage measured by the voltage measuring unit 123 for a reference time from when the switch 121 is short-circuited, and diagnose the state of the relay 125 based on the measured change amount. Herein, the controller 124 may control the switch 121 and the relay 125 to be short-circuited at the same time, and after the controller 124 controls the relay 125 to be short-circuited, the switch 121 may be short-circuited.

The controller 124 may diagnose the state of the relay 125 by comparing the measured change amount with a first reference change amount or a second reference change amount. For example, the first reference change amount may be defined as the amount of change in a voltage previously measured by the voltage measuring unit 123 for a reference time from when the switch 121 is short-circuited in an open state of the relay 125, and the second reference change amount may be defined as the amount of change in a voltage previously measured by the voltage measuring unit 123 for a reference time from when the switch 121 is short-circuited in a short-circuited state of the relay 125.

The controller 124 may diagnose, as faulty, a state where the relay 125 is opened unintentionally or due to a malfunction without being short-circuited, in a state where the relay 125 is controlled to be short-circuited. This will be described in more detail with reference to FIGS. 3 through 5 below.

The relay 125 may be connected between the battery module 110 and the load 200. For example, an end of the relay 125 may be electrically connected to the battery module 110, and the other end of the relay 125 may be electrically connected to the load 200. The relay 125 may be opened or short-circuited in response to control by the controller 124. When the relay 125 is short-circuited, the load 200 may be provided with power from the battery module 110.

According to an embodiment, the relay 125 may be designed to be included in the relay state management apparatus 120, and may be designed to electrically connect the battery module 110 to the load 200 separately from the relay state management apparatus 120. For example, when the relay 125 is designed separately from the relay state management apparatus 120, in one aspect, the relay state management apparatus 120 may be understood as a configuration for measuring an insulating resistance of the battery pack 100.

Figure 3:
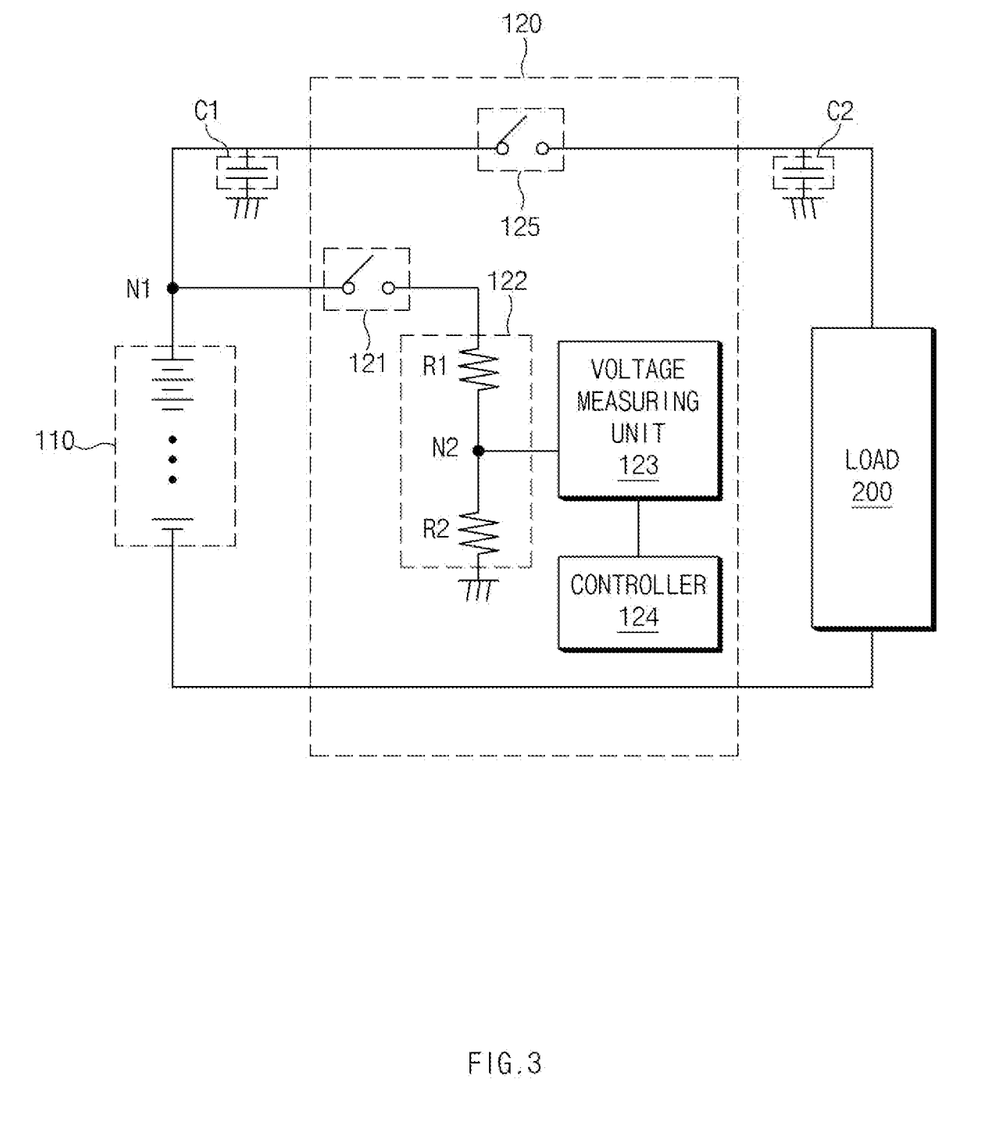
FIG. 3 is a circuit diagram showing a relay state management apparatus according to an embodiment disclosed herein.
Figure 4:
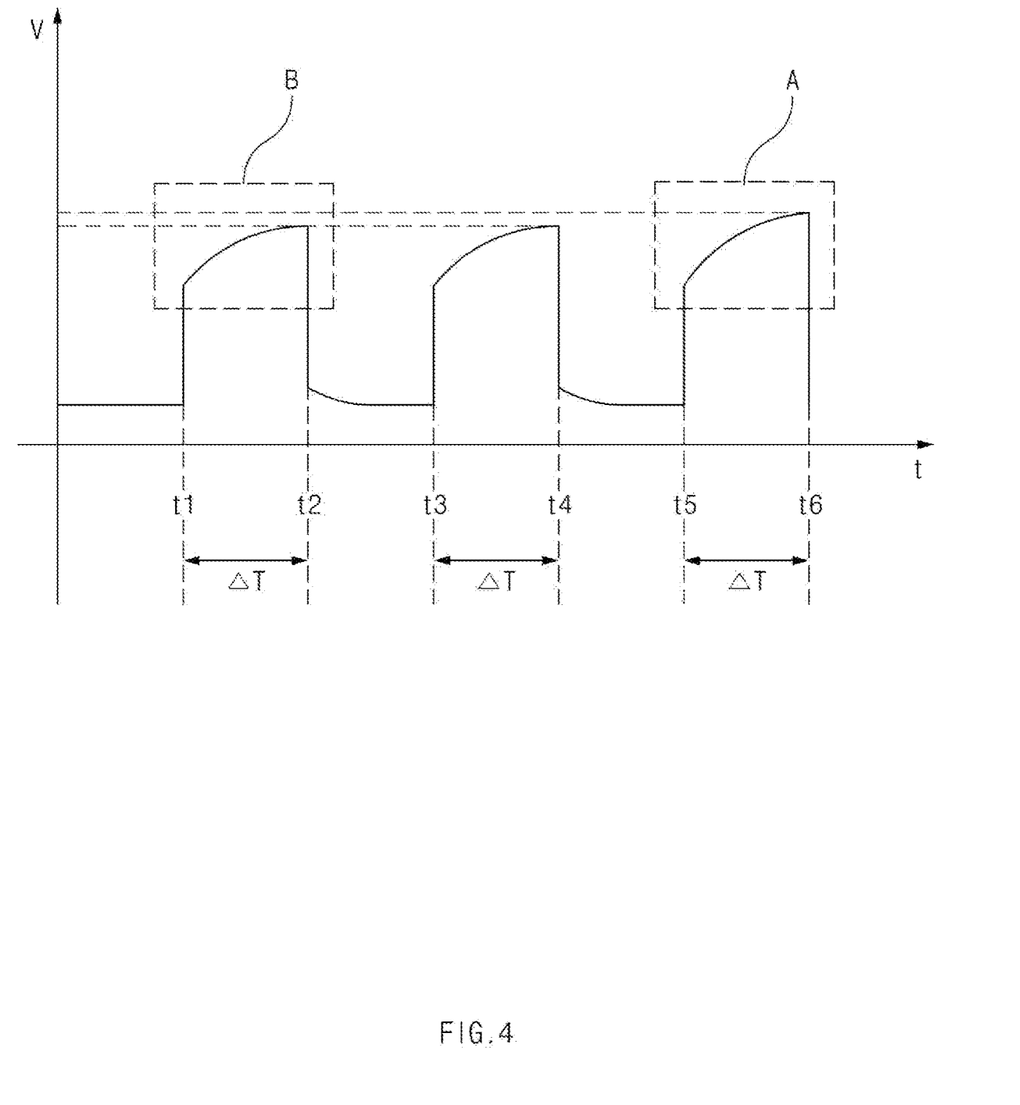
FIGS. 4 and 5 are views for describing an operation of a relay state management apparatus, according to an embodiment disclosed herein.
Figure 5:
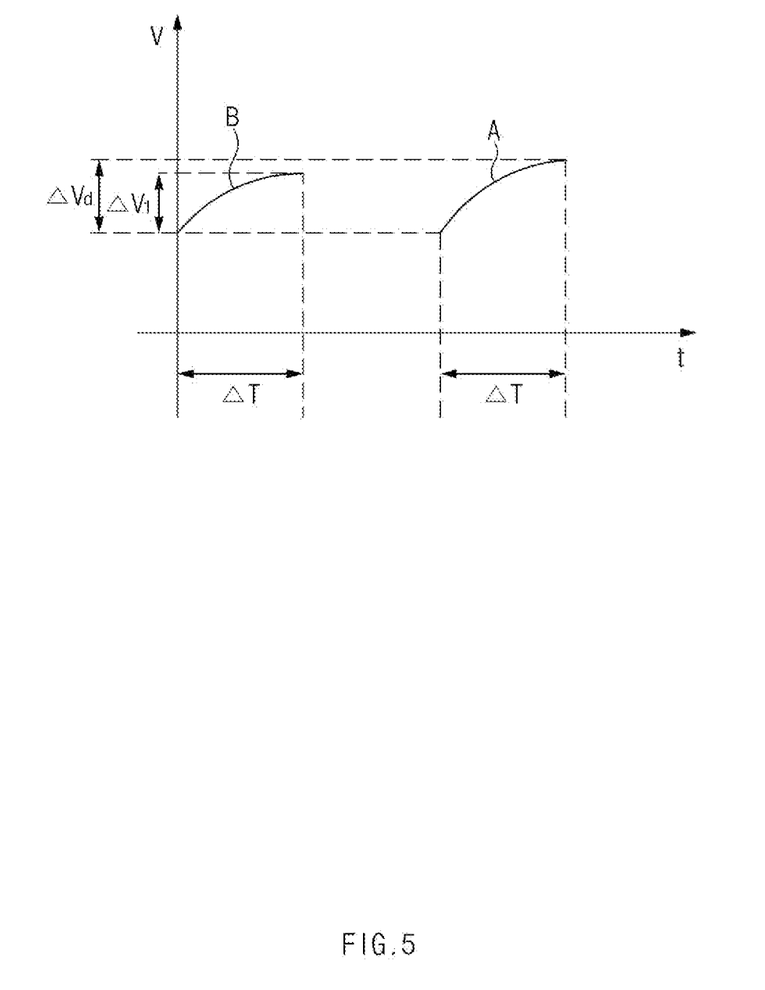

FIG. 3 is a circuit diagram showing a relay state management apparatus according to an embodiment disclosed herein. FIGS. 4 and 5 are views for describing an operation of a relay state management apparatus, according to an embodiment disclosed herein.

Referring to FIG. 3, the relay state management apparatus 120 may include a switch 121, a resistor unit 122, a voltage measuring unit 123, a controller 124, and a relay 125.

The end of the switch 121 may be connected to the anode of the battery module 110, and the other end of the switch 121 may be connected to the resistor unit 122. The switch 121 may be connected to the relay 125 around a first node N1. The switch 121 may be opened or short-circuited in response to control by the controller 124.

The resistor unit 122 may include a first resistor R1 and a second resistor R2. The first resistor R1 and the second resistor R2 may be serially connected to each other. The first resistor R1 may be connected to the other end of the switch 121. The second resistor R2 may be connected to the ground. The first resistor R1 and the second resistor R2 may be electrically connected to the battery module 110 when the switch 121 is short-circuited.

The voltage measuring unit 123 may measure a voltage of a second node N2. In an aspect, the voltage measuring unit 123 may be understood as measuring a voltage applied to the second resistor R2. The voltage measuring unit 123 may measure the voltage of the second node N2 when the switch 121 is short-circuited while the relay 125 is controlled to be short-circuited. The voltage measuring unit 123 may transmit the measured voltage to the controller 124. For example, the voltage measuring unit 123 may measure the voltage of the second node N2 in real time to transmit the measured voltage to the controller 124.

The controller 124 may diagnose the state of the relay 125 based on the voltage measured by the voltage measuring unit 123.

Referring to FIGS. 3 and 4, when the relay 125 is short-circuited at a fifth time t5 in the open state, thus being opened at a sixth time t6, the voltage of the second node N2 measured by the voltage measuring unit 123 may be changed into a pattern as indicated by A. Herein, a difference between the fifth time t5 and the sixth time t6 may be defined as a reference time, e.g., 200 ms, but may be set variously according to an embodiment, without being limited thereto. As in A, a time constant $\tau$ determining change of the voltage of the second node N2 may be determined as a product of a sum of the first resistor R1 and the second resistor R2 and a first capacitive component C1 (e.g., a capacitor component of the battery pack 100).

Referring to FIG. 5, when the switch 121 is short-circuited for a reference time in the open state of the relay 125 (i.e., for A), the voltage measured at the second node N2 may be defined as a first reference change amount $\Delta Vd$ for the reference time. In the open state of the relay 125, the time constant $\tau$ decreases, such that a voltage change amount of the second node N2 for the same reference time may be greater than that of the second node N2 for the reference time in the short-circuited state of the relay 125.

Referring back to FIGS. 3 and 4, when the switch 121 is short-circuited at a first time t1 and thus is open at a second time t2, in the short-circuited state of the relay 125, the voltage of the second node N2 measured by the voltage measuring unit 123 may be changed into a pattern as indicated by B. Herein, a difference between the first time t1 and the second time t2 may be defined as the reference time. The voltage change pattern as indicated by B may appear identical or similar even when the switch 121 is short-circuited at a third time t3 and thus is opened at a fourth time t4 in the short-circuited state of the relay 125. In a normal short-circuited state of the relay 125, the time constant $\tau$ determining change of the voltage of the second node N2 may be determined as a product of a sum of the first resistor R1 and the second resistor R2 and the first capacitive component C1 (e.g., the capacitor component of the battery pack 100) and a second capacitive component C2 (e.g., a capacitor component of the load 200).

Referring to FIG. 5, when the switch 121 is short-circuited for a reference time in the normally short-circuited state of the relay 125 (i.e., for B), the voltage measured at the second node N2 may be defined as a second reference change amount $\Delta V1$ for the reference time.

Referring back to FIG. 3, while controlling the relay 125 to be short-circuited, the controller 124 may diagnose the state of the relay 125 based on the measured change amount that is the amount of change in the voltage measured by the voltage measuring unit 123 for the reference time from when the switch 121 is short-circuited.

The controller 124 may diagnose the state of the relay 125 by comparing the measured change amount with the previously obtained first reference change amount $\Delta Vd$ or second reference change amount $\Delta V1$. For example, the first reference change amount may be defined as the amount of change in the voltage previously measured by the voltage measuring unit 123 for a reference time from when the switch 121 is short-circuited in an open state of the relay 125, and the second reference change amount may be defined as the amount of change in the voltage previously measured by the voltage measuring unit 123 for a reference time from when the switch 121 is short-circuited in a short-circuited state of the relay 125.

The controller 124 may diagnose the state of the relay 125 as faulty when the measured change amount is equal to or greater than a value obtained by multiplying the first reference change amount $\Delta Vd$ by a predetermined rate, and diagnose the state of the relay 125 as normal when the measured change amount is less than a value obtained by multiplying the first reference change amount $\Delta Vd$ by the predetermined rate. Herein, the predetermined rate may be set to 0.9, but is not limited thereto, and may be set variously according to embodiments.

The controller 124 may diagnose the state of the relay 125 as normal when the measured change amount is within a predetermined range from the second reference change amount $\Delta V1$, and may diagnose the state of the relay 125 as faulty when the measured change amount is out of the predetermined range from the second reference change amount $\Delta V1$.

Thus, the controller 124 may diagnose, as faulty, a state where the relay 125 is opened unintentionally or due to a malfunction without being short-circuited, in a state where the relay 125 is controlled to be short-circuited.

Figure 6:
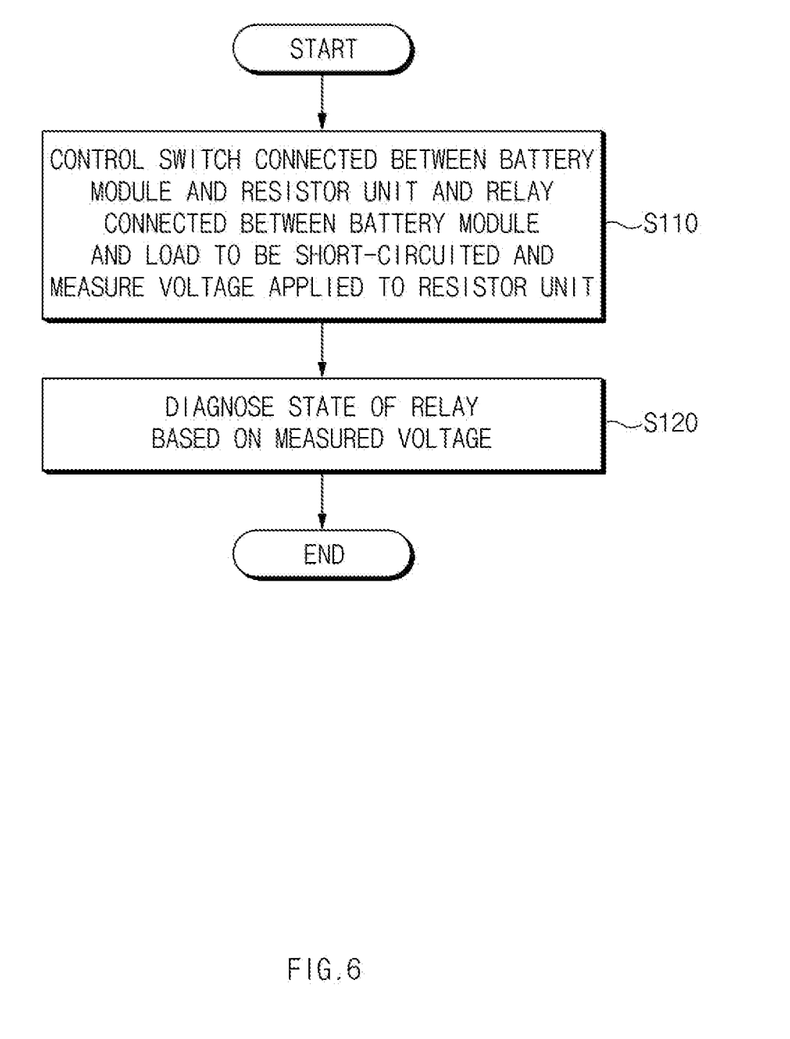
FIG. 6 is a flowchart showing an operating method of a relay state management apparatus according to an embodiment disclosed herein.

FIG. 6 is a flowchart showing an operating method of a relay state management apparatus according to an embodiment disclosed herein.

Referring to FIG. 6, an operating method of a relay state management apparatus according to an embodiment disclosed herein may include operation S110 of controlling a switch connected between a battery module and a resistor unit and a relay connected between a battery module and a load to be short-circuited and measuring a voltage applied to the resistor unit and operation S120 of diagnosing a state of the relay based on the measured voltage.

Hereinbelow, operations S110 and S120 will be described in detail with reference to FIGS. 2 and 3.

In operation S110, the voltage measuring unit 123 may measure a voltage applied to the resistor unit 122. As described with reference to FIG. 3, the voltage measuring unit 123 may measure the voltage of the second node N2. For example, the voltage measuring unit 123 may measure the voltage applied to the resistor unit 122 when the switch 121 is short-circuited while the relay 125 is controlled to be short-circuited. The voltage measuring unit 123 may transmit the measured voltage to the controller 124. For example, the voltage measuring unit 123 may measure the voltage applied to the resistor unit 122 in real time to transmit the measured voltage to the controller 124.

Meanwhile, the end of the switch 121 may be connected to the anode of the battery module 110, and the other end of the switch 121 may be connected to the resistor unit 122. The switch 121 may be connected to the relay 125 around a first node N1. The resistor unit 122 may include a first resistor R1 and a second resistor R2. The first resistor R1 and the second resistor R2 may be serially connected to each other. The first resistor R1 may be connected to the other end of the switch 121. The second resistor R2 may be connected to the ground. The first resistor R1 and the second resistor R2 may be electrically connected to the battery module 110 when the switch 121 is short-circuited.

In operation S120, the controller 124 may diagnose the state of the relay 125 based on the voltage measured by the voltage measuring unit 123. The controller 124 may diagnose, as faulty, a state where the relay 125 is opened unintentionally or due to a malfunction without being short-circuited, in a state where the relay 125 is controlled to be short-circuited. Operation S120 will be described in more detail with reference to FIGS. 7 and 8 below.

Meanwhile, operations S110 and S120 may be performed, without being limited to, when a current flowing through the switch 121 and the resistor unit 122 is greater than or equal to a maximum allowable current of the battery pack 100 by 20% thereof in the case that the switch 121 is short-circuited in the short-circuited state of the relay 125.

Figure 7:
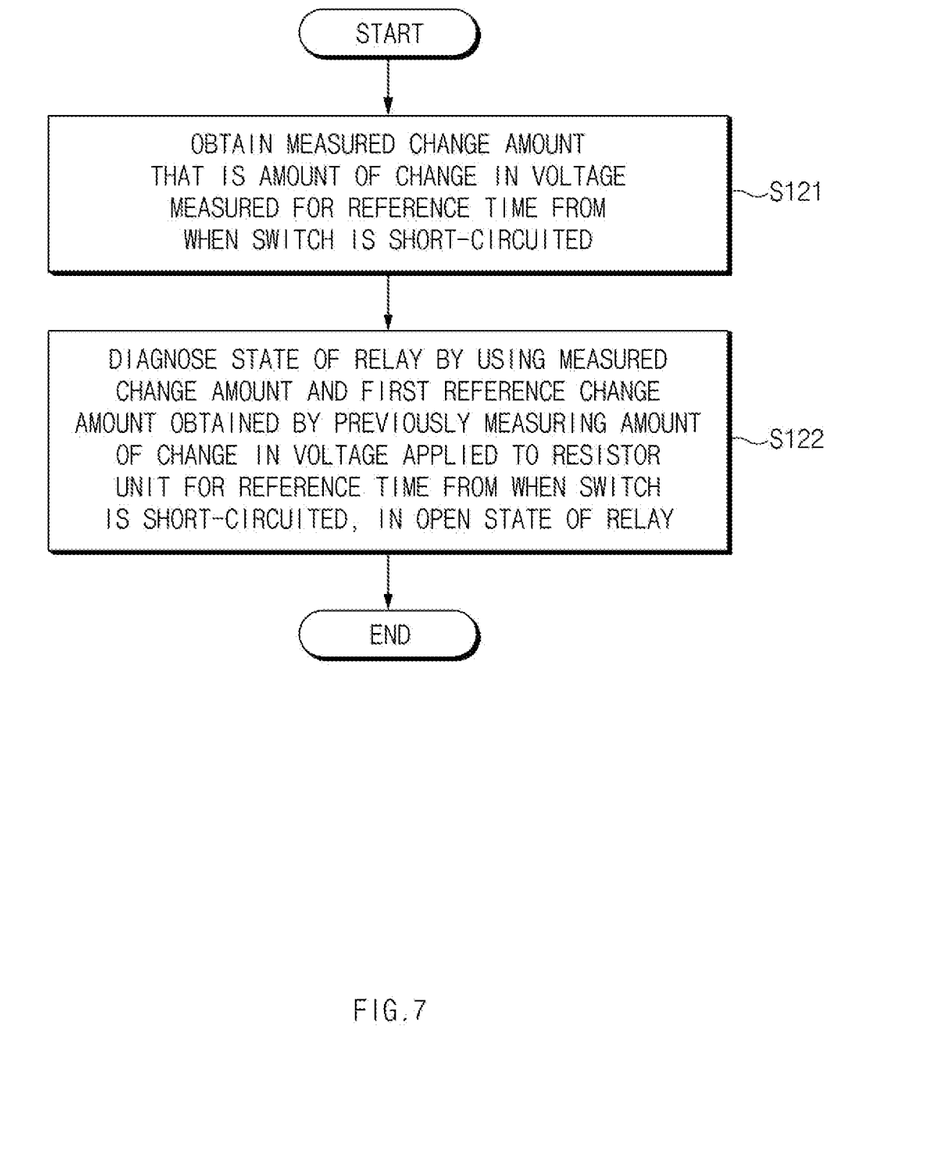
FIG. 7 is a flowchart for describing in detail an operating method of a relay state management apparatus according to an embodiment disclosed herein.

FIG. 7 is a flowchart for describing in detail an operating method of a relay state management apparatus according to an embodiment disclosed herein.

Referring to FIG. 7, operation S120 described with reference to FIG. 6 may include operation S121 of obtaining a measured change amount that is the amount of change in a voltage measured for a reference time from when the switch is short-circuited and operation S122 of diagnosing a state of a relay by using the measured change amount and a first reference change amount obtained by previously measuring the amount of change in a voltage applied to a resistor unit for the reference time from when the switch is short-circuited in an open state of the relay.

In operation S121, while controlling the relay 125 to be short-circuited, the controller 124 may obtain a measured change amount that is the amount of change in the voltage measured by the voltage measuring unit 123 for a reference time from when the switch 121 is short-circuited.

In operation S122, the controller 124 may diagnose the state of the relay 125 by comparing the measured change amount with the previously obtained first reference change amount $\Delta Vd$. For example, the first reference change amount may be defined as the amount of change in the voltage previously measured by the voltage measuring unit 123 for the reference time from when the switch 121 is short-circuited, in the open state of the relay 125.

The controller 124 may diagnose the state of the relay 125 as faulty when the measurement change amount is equal to or greater than a value obtained by multiplying the first reference change amount $\Delta Vd$ by a predetermined rate, and diagnose the state of the relay 125 as normal when the measured change amount is less than a value obtained by multiplying the first reference change amount $\Delta Vd$ by the predetermined rate. Herein, the predetermined rate may be set to 0.9, but is not limited thereto, and may be set variously according to embodiments.

Thus, the controller 124 may diagnose, as faulty, a state where the relay 125 is opened unintentionally or due to a malfunction without being short-circuited, in a state where the relay 125 is controlled to be short-circuited.

Figure 8:
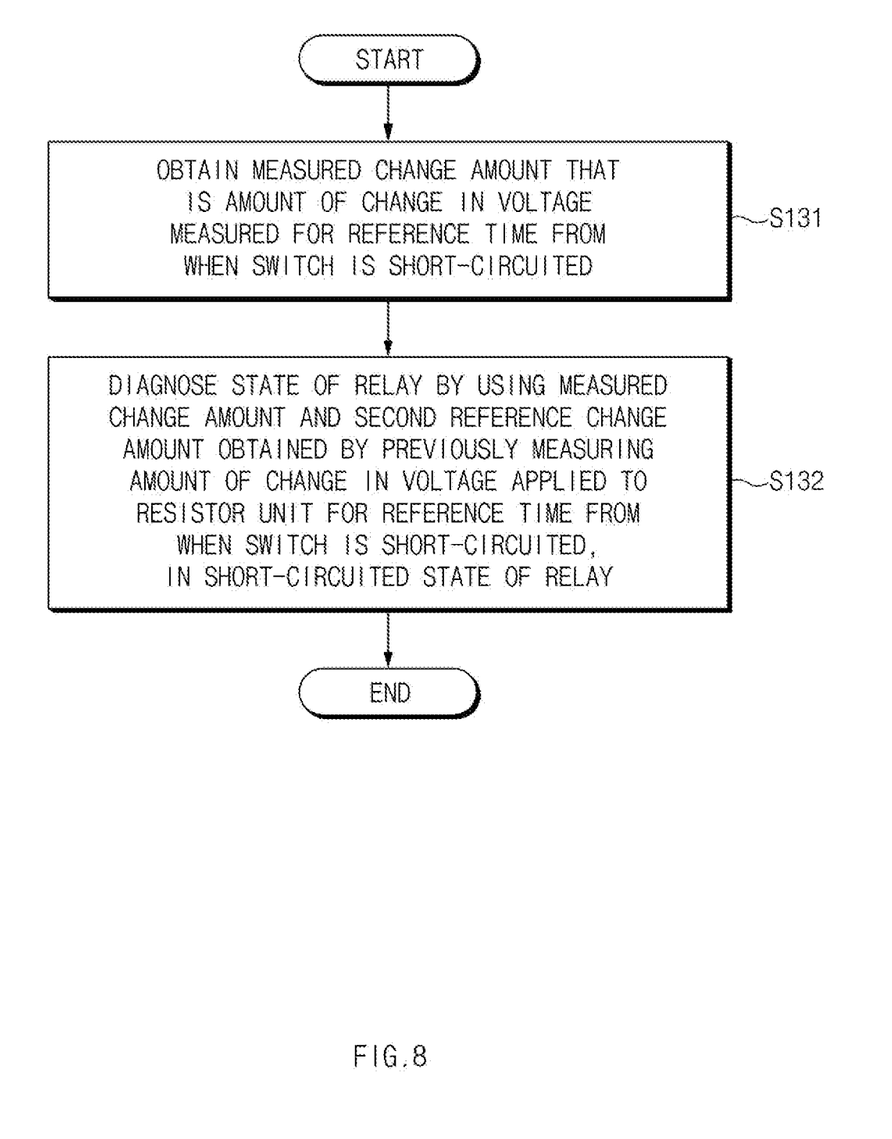
FIG. 8 is a flowchart for describing in detail an operating method of a relay state management apparatus according to another embodiment disclosed herein.

FIG. 8 is a flowchart for describing in detail an operating method of a relay state management apparatus according to another embodiment disclosed herein.

Referring to FIG. 8, operation S120 described with reference to FIG. 6 may include operation S131 of obtaining a measured change amount that is the amount of change in a voltage measured for a reference time from when the switch is short-circuited and operation S132 of diagnosing a state of a relay by using the measured change amount and a second reference change amount obtained by previously measuring the amount of change in a voltage applied to a resistor unit for the reference time from when the switch is short-circuited in a short-circuited state of the relay.

In operation S131, while controlling the relay 125 to be short-circuited, the controller 124 may obtain a measured change amount that is the amount of change in the voltage measured by the voltage measuring unit 123 for a reference time from when the switch 121 is short-circuited.

In operation S132, the controller 124 may diagnose the state of the relay 125 by comparing the measured change amount with the previously obtained second reference change amount $\Delta V1$. For example, the second reference change amount may be defined as the amount of change in the voltage previously measured by the voltage measuring unit 123 for the reference time from when the switch 121 is short-circuited, in the short-circuited state of the relay 125.

The controller 124 may diagnose the state of the relay 125 as normal when the measurement change amount is within a predetermined range from the second reference change amount $\Delta V1$, and may diagnose the state of the relay 125 as faulty when the measurement change amount is out of the predetermined range from the second reference change amount $\Delta V1$.

Thus, the controller 124 may diagnose, as faulty, a state where the relay 125 is opened unintentionally or due to a malfunction without being short-circuited, in a state where the relay 125 is controlled to be short-circuited.

The above description is merely illustrative of the technical idea of the present invention, and various modifications and variations will be possible without departing from the essential characteristics of embodiments of the present invention by those of ordinary skill in the art to which the embodiments disclosed herein pertains.

Therefore, the embodiments disclosed herein are intended for description rather than limitation of the technical spirit of the embodiments disclosed herein and the scope of the technical spirit of the present invention is not limited by these embodiments disclosed herein. The protection scope of the technical spirit disclosed herein should be interpreted by the following claims, and all technical spirits within the same range should be understood to be included in the range of the present invention.

The invention claimed is:

1. A relay state management apparatus comprising:
a circuit for supplying power from a battery module to a load, the circuit comprising:
a switch connected to an end of the battery module;
one or more resistors connected to the switch;
a voltage sensor measuring a voltage applied to the one or more resistors;
a relay connected between the battery module and the load along an electrical path;
a capacitor connected to the electrical path between a node of the electrical path and ground; and
a controller configured to:
control the switch and the relay to be short-circuited for a predetermined duration;
calculate a voltage difference between the voltage measured by the voltage sensor at a beginning of the predetermined duration and the voltage measured by the voltage sensor at an end of the predetermined duration;
diagnose a state of the relay based on the calculated voltage difference.

2. The relay state management apparatus of claim 1, wherein the controller is configured to diagnose the state of the relay based on the calculated voltage difference and a reference change amount that is an amount of change in the voltage previously measured by the voltage sensor for a second predetermined duration beginning from when the controller controls the switch to be short-circuited in an open state of the relay.

3. The relay state management apparatus of claim 2, wherein the controller is configured to:
diagnose the state of the relay as faulty in response to the calculated voltage difference being greater than or equal to a value obtained by multiplying the reference change amount by a predetermined rate; and
diagnose the state of the relay as normal in response to the calculated voltage difference being less than the value obtained by multiplying the reference change amount by the predetermined rate.

4. The relay state management apparatus of claim 1, wherein the controller is configured to diagnose the state of the relay based on the calculated voltage difference and a reference change amount that is an amount of change in the voltage previously measured by the voltage sensor for a duration beginning from when the controller controls the switch to be short-circuited in a short-circuited state of the relay.

5. The relay state management apparatus of claim 4, wherein the controller is configured to:
diagnose the state of the relay as normal in response to the calculated voltage difference being within a predetermined range from the reference change amount; and
diagnose the state of the relay as faulty in response to the calculated voltage difference being out of the predetermined range from the reference change amount.

6. The relay state management apparatus of claim 1, wherein the one or more resistors comprises at least two resistors including a first resistor and a second resistor that are serially connected to each other.

7. The relay state management apparatus of claim 6, wherein the voltage sensor is configured to measure a voltage applied to the second resistor.

8. The relay state management apparatus of claim 1, wherein the switch is connected to an anode terminal of the battery module.

9. An operating method of a relay state management apparatus, the operating method comprising:
controlling operation of a switch included in a circuit for supplying power from a battery module to a load, wherein the switch is connected between the battery module and one or more resistors included in the circuit;
controlling operation of a relay connected between the battery module and the load along an electrical path, wherein controlling operation of the switch and the relay comprises controlling the switch and the relay to be short-circuited for a predetermined duration;
measuring, using a voltage sensor included in the circuit, a first voltage applied to the one or more resistors at a beginning of the predetermined duration and a second voltage applied to the one or more resistors at an end of the predetermined duration, wherein the first voltage changes to the second voltage over the predetermined duration at least in part as a function of a capacitor connected to the electrical path between a node of the electrical path and ground;
calculating a voltage difference between the measured first voltage and the measured second voltage; and
diagnosing a state of the relay based on the calculated voltage difference.

10. The operating method of claim 9, wherein diagnosing the state of the relay based on the calculated voltage difference comprises:
diagnosing the state of the relay based on the calculated voltage difference and a reference change amount obtained by previously measuring an amount of change in voltage applied to the one or more resistors for a second predetermined duration beginning from when the switch is short-circuited in an open state of the relay.

11. The operating method of claim 10, further comprising calculating a value by multiplying the reference change amount by a predetermined rate, wherein diagnosing the state of the relay comprises diagnosing whether the state of the relay is faulty or normal depending on whether the calculated voltage difference is at least or less than the calculated value, respectively.

12. The operating method of claim 9, wherein diagnosing the state of the relay based on the calculated voltage difference comprises:
diagnosing the state of the relay based on the calculated voltage difference and a reference change amount obtained by previously measuring an amount of change in voltage applied to the one or more resistors for a second predetermined duration beginning from when the switch is short-circuited in a short-circuited state of the relay.

13. The operating method of claim 12, wherein diagnosing the state of the relay comprises diagnosing whether the state of the relay is normal or faulty depending on whether the calculated voltage difference is within or outside of a predetermined range from the reference change amount, respectively.

* * * * *